United States Patent
Islam et al.

(10) Patent No.: US 11,475,961 B1
(45) Date of Patent: Oct. 18, 2022

(54) NONVOLATILE MEMORY WITH EFFICIENT LOOK-AHEAD READ

(71) Applicant: SanDisk Technologies LLC, Addison, TX (US)

(72) Inventors: Sujjatul Islam, San Jose, CA (US); Ravi J. Kumar, Redwood City, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/307,396

(22) Filed: May 4, 2021

(51) Int. Cl.
| | |
|---|---|
| *G11C 16/34* | (2006.01) |
| *G11C 16/14* | (2006.01) |
| *G11C 16/10* | (2006.01) |
| *G11C 16/30* | (2006.01) |
| *G11C 16/08* | (2006.01) |
| *G11C 16/26* | (2006.01) |

(52) U.S. Cl.
CPC .............. *G11C 16/14* (2013.01); *G11C 16/08* (2013.01); *G11C 16/102* (2013.01); *G11C 16/26* (2013.01); *G11C 16/30* (2013.01); *G11C 16/3431* (2013.01)

(58) Field of Classification Search
CPC ....... G11C 16/14; G11C 16/08; G11C 16/102; G11C 16/26; G11C 16/30; G11C 16/3431
See application file for complete search history.

(56) References Cited

U.S. PATENT DOCUMENTS

| | | | |
|---|---|---|---|
| 2010/0034022 A1 | 2/2010 | Dutta et al. | |
| 2014/0269086 A1 | 9/2014 | Lasser | |
| 2014/0281766 A1* | 9/2014 | Yang | G11C 11/56 714/721 |
| 2015/0085571 A1* | 3/2015 | Hu | G11C 11/5642 365/185.21 |
| 2016/0005491 A1 | 1/2016 | Yuan et al. | |
| 2016/0260495 A1 | 9/2016 | Paudel et al. | |
| 2020/0327933 A1 | 10/2020 | El Gamal et al. | |

* cited by examiner

*Primary Examiner* — Jay W. Radke
(74) *Attorney, Agent, or Firm* — Vierra Magen Marcus LLP

(57) ABSTRACT

An apparatus includes one or more control circuits configured to connect to a plurality of non-volatile memory cells through a plurality of word lines. The one or more control circuits are configured to, for each target word line of a plurality of target word lines to be read, select either a first neighboring word line or a second neighboring word line as a selected neighboring word line according to whether non-volatile memory cells of the first neighboring word line are in an erased condition. The one or more control circuits are further configured to determine a read voltage to read non-volatile memory cells of a corresponding target word line according to an amount of charge in non-volatile memory cells of the selected neighboring word line.

20 Claims, 19 Drawing Sheets

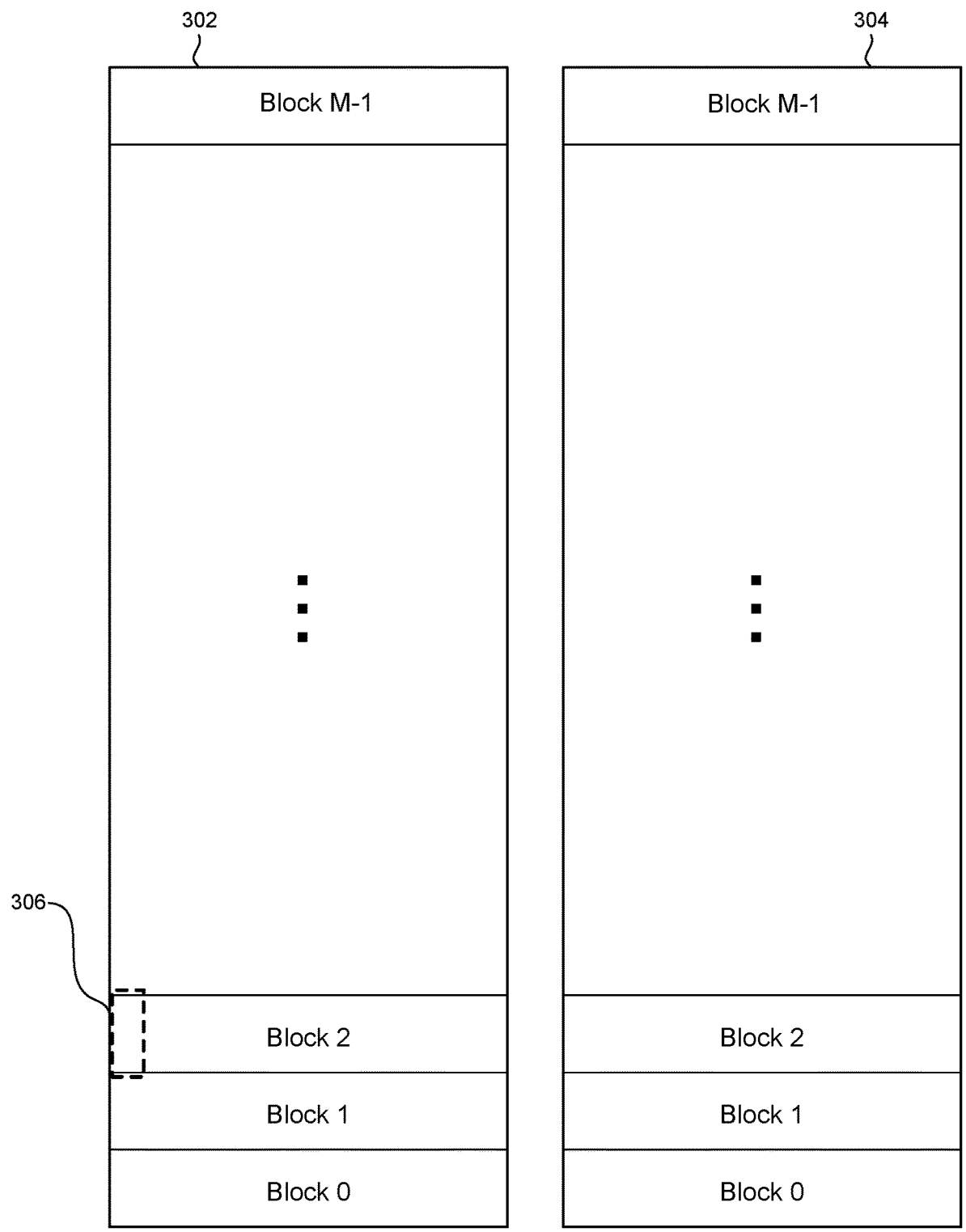

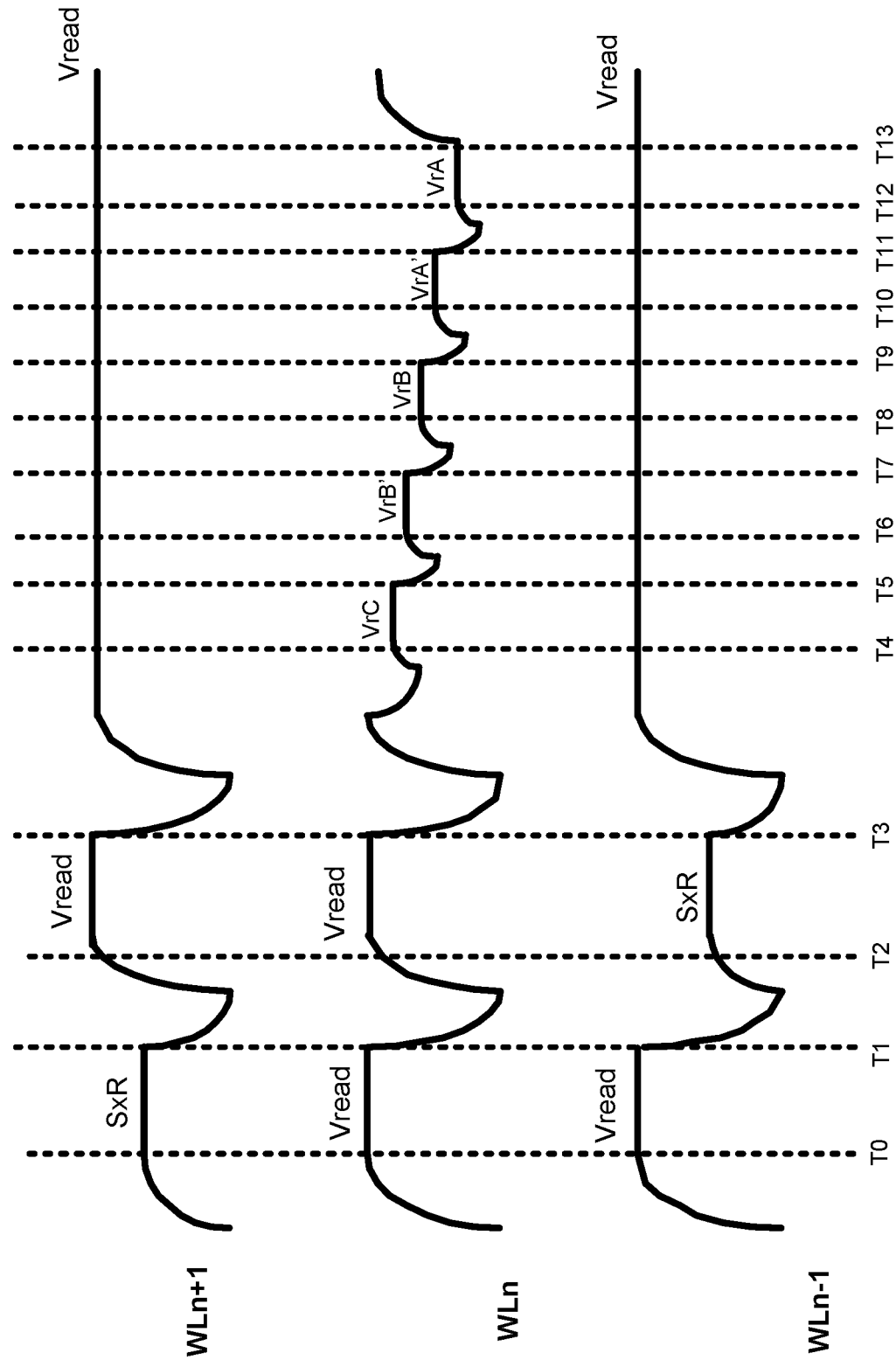

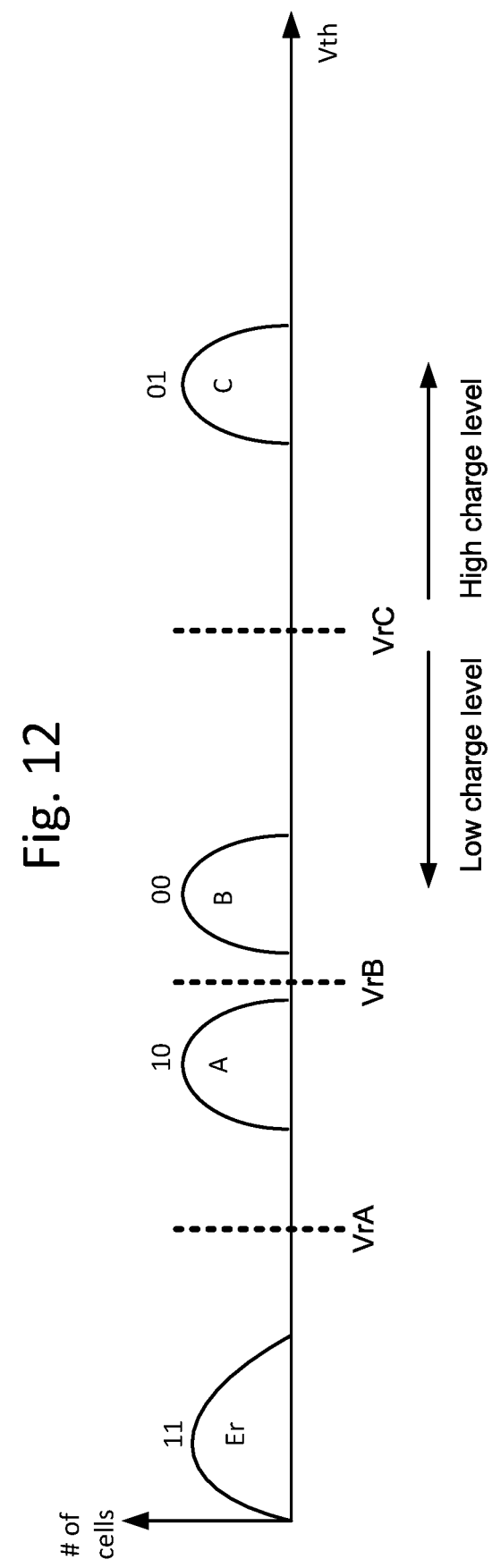

US 11,475,961 B1

NONVOLATILE MEMORY WITH EFFICIENT LOOK-AHEAD READ

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. Some memory cells store information by storing a charge in a charge storage region. Other memory cells store information using other techniques, such as by the resistance of the memory cell. Some memories store one bit per cell using two data states (Single Level Cell or SLC) while others store more than one bit per cell using more than two data states (Multi Level Cell or MLC).

When a memory system is deployed in or connected to an electronic device (the host), the memory system can be used to store data and read data. It is generally desirable that reading is performed accurately and rapidly and this may be challenging in some memories, for example, in MLC memories.

BRIEF DESCRIPTION OF THE DRAWINGS

Like-numbered elements refer to common components in the different Figures.

FIG. 4A is a block diagram of a memory structure having two planes.

FIGS. 10A-B show examples of voltages on word lines during read operations.

FIG. 12 illustrates an example of reading MLC programmed data.

DETAILED DESCRIPTION

Techniques are disclosed herein to enable efficient reading of non-volatile memory cells. For example, in some cases, different read voltages may be used to read non-volatile memory cells according to the amount of charge (charge level) in non-volatile memory cells of a neighboring word line. A single neighboring word line may be selected for use in a look-ahead read to determine appropriate read voltages for non-volatile memory cells of a target word line to be read. The neighboring word line that is selected may depend on whether a subsequent neighboring word line in programming order is programmed or not. If the subsequent neighboring word line is programmed, then it may be the selected neighboring word line and if the subsequent neighboring word line is not programmed then the prior neighboring word line (prior to the target word line to be read according to the predetermined programming order) may be the selected neighboring word line. The amount of charge in non-volatile memory cells of the selected neighboring word line (e.g., either prior or subsequent word line) is then used to determine which of two or more read voltages to use to read non-volatile memory cells of the target word line. For example, a non-volatile memory cell may be read using a higher read voltage or a lower read voltage depending on the amount of charge in a corresponding non-volatile memory cell in the selected neighboring word line (e.g., above or below a threshold amount).

Figure 1A:
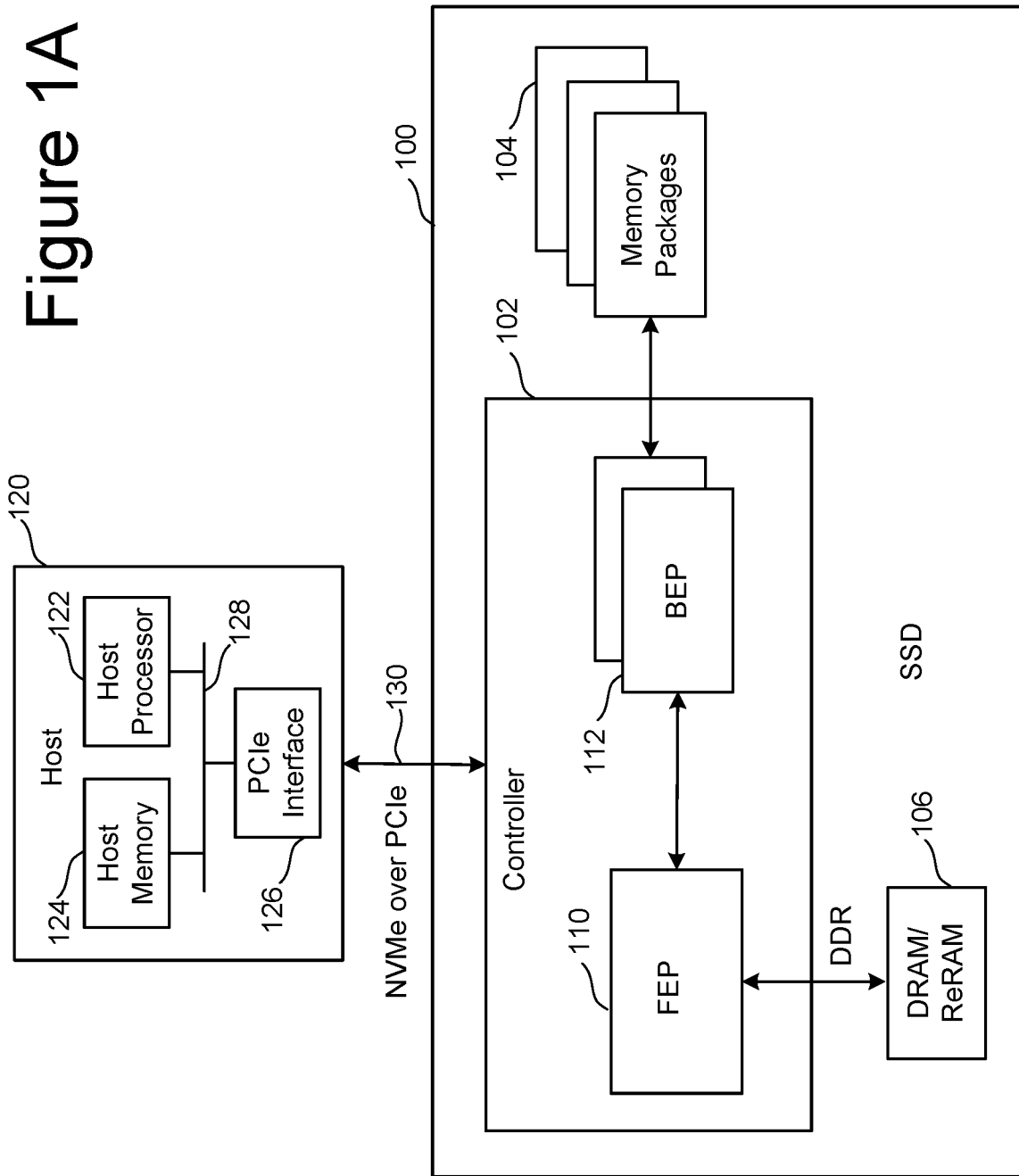
FIG. 1A is a block diagram of one embodiment of a memory system connected to a host.

FIG. 1A is a block diagram of one embodiment of a memory system 100 connected to a host 120. Memory system 100 can implement the technology proposed herein. Many different types of memory systems can be used with the technology proposed herein. One example memory system is a solid-state drive ("SSD"); however, other types of memory systems can also be used. Memory system 100 comprises a Controller 102, non-volatile memory 104 for storing data, and local memory (e.g., DRAM/ReRAM) 106. Controller 102 comprises a Front-End Processor Circuit (FEP) 110 and one or more Back End Processor Circuits (BEP) 112. In one embodiment FEP circuit 110 is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP circuit 110 and BEP 112 work as a master slave configuration where the FEP circuit 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two-dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
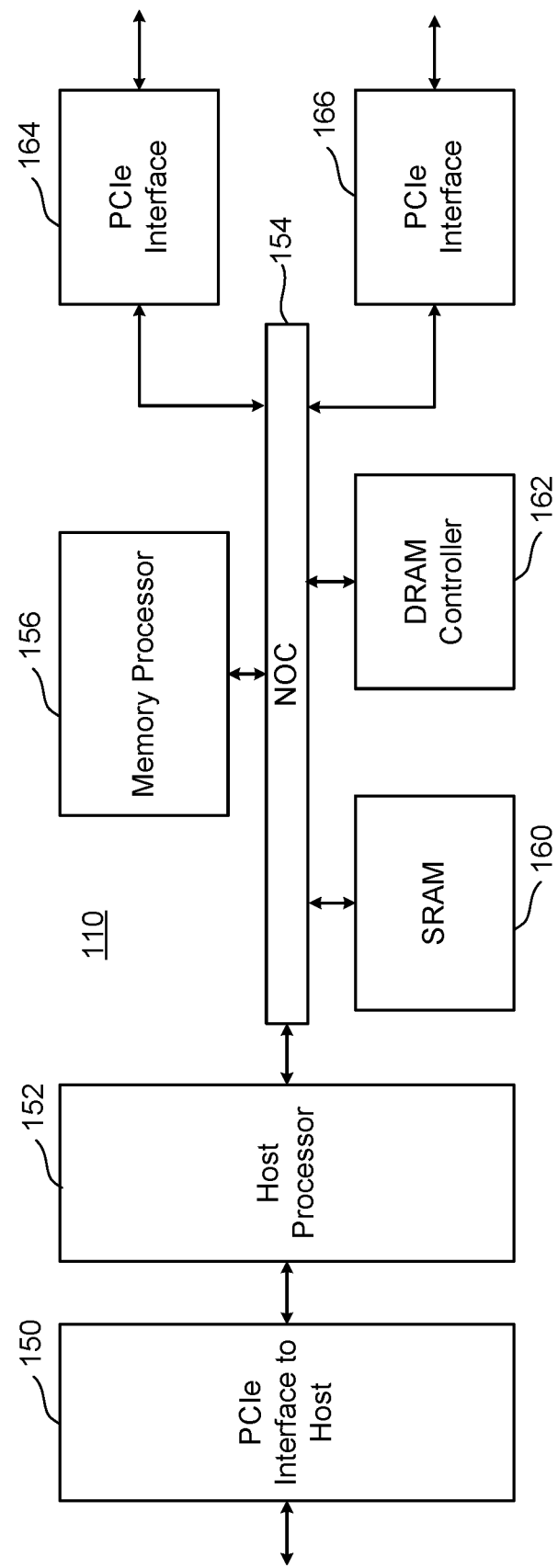
FIG. 1B is a block diagram of one embodiment of a Front-End Processor Circuit. In some embodiments, the Front-End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
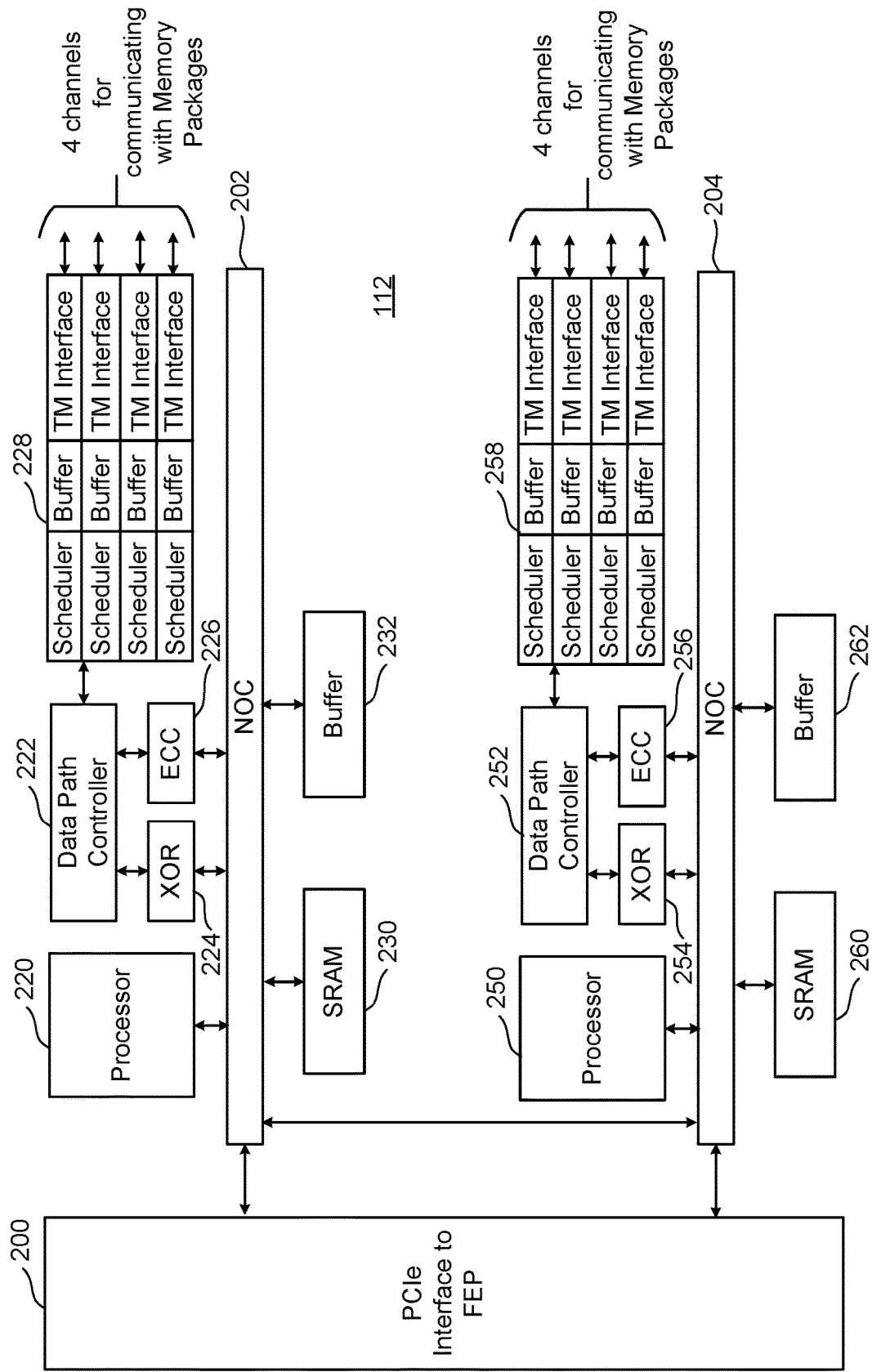
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
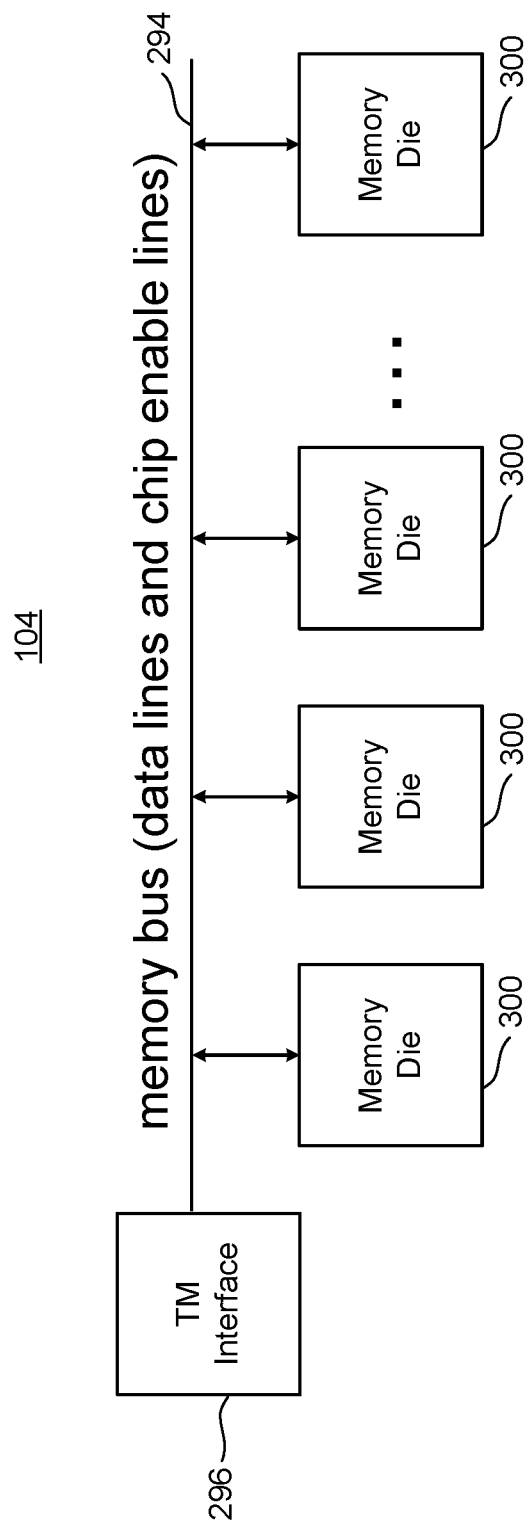
FIG. 1D is a block diagram of one embodiment of a memory package.

FIG. 1D is a block diagram of one embodiment of a memory package 104 that includes a plurality of memory die 300 connected to a memory bus 294 (data lines and chip enable lines). The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2:
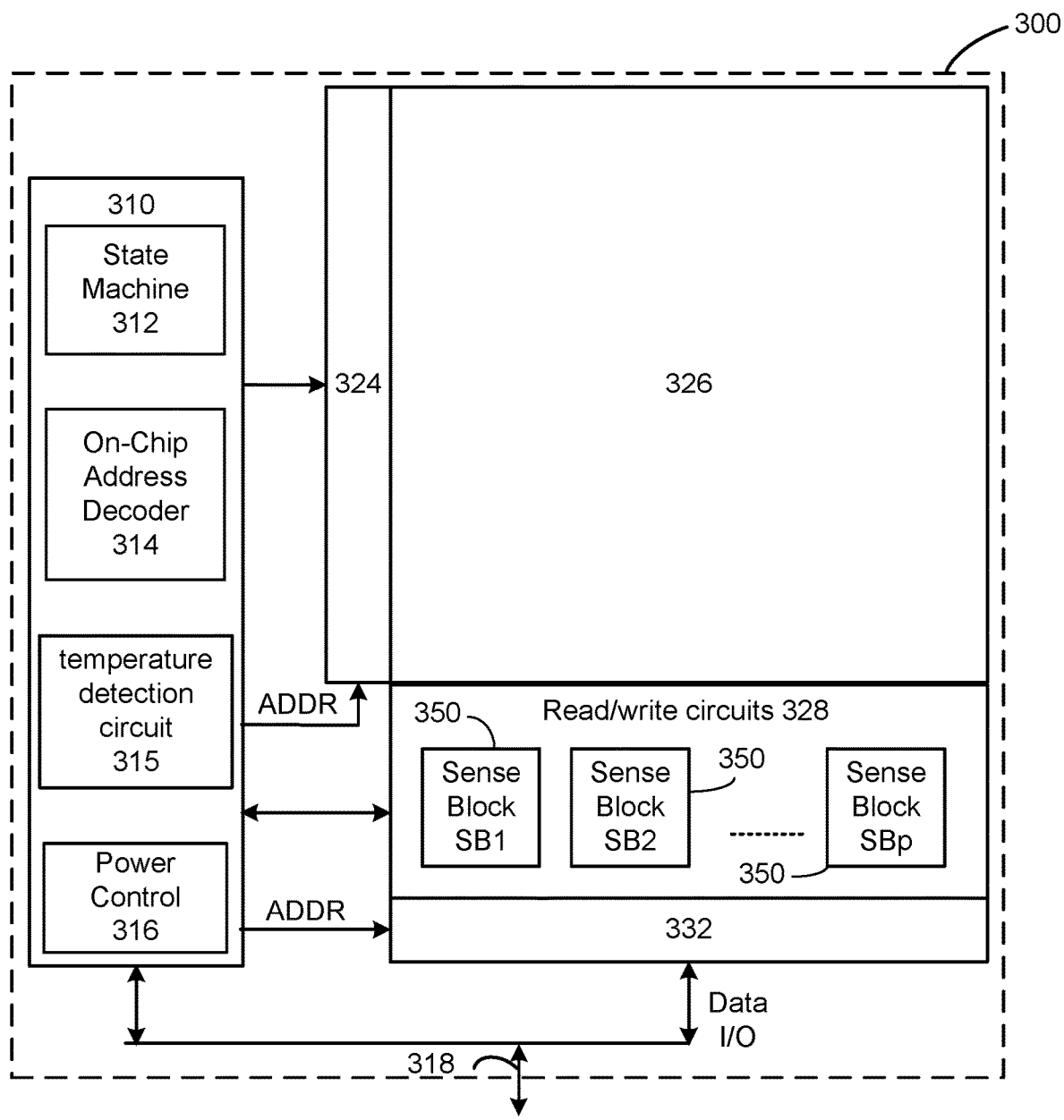
FIG. 2 is a block diagram of one embodiment of a memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuits 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuits) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller and the memory die 300 via lines 318, which may form a bus between memory die 300 and the controller (e.g., memory bus 294). In one embodiment, memory die 300 includes a set of input and/or output (I/O) pins that connect to lines 318.

Control circuits 310 cooperate with the read/write circuits 328 to perform memory operations (e.g., write, read, erase, and others) on memory structure 326. In one embodiment, control circuits 310 includes a state machine 312, an on-chip address decoder 314, a power control module 316 (power control circuit) and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuits 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuits 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuits 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

In one embodiment, the control circuit(s) (e.g., control circuits 310) are formed on a first die, referred to as a control die, and the memory array (e.g., memory structure 326) is formed on a second die, referred to as a memory die. For example, some or all control circuits (e.g., control circuit 310, row decoder 324, column decoder 332, and read/write circuits 328) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
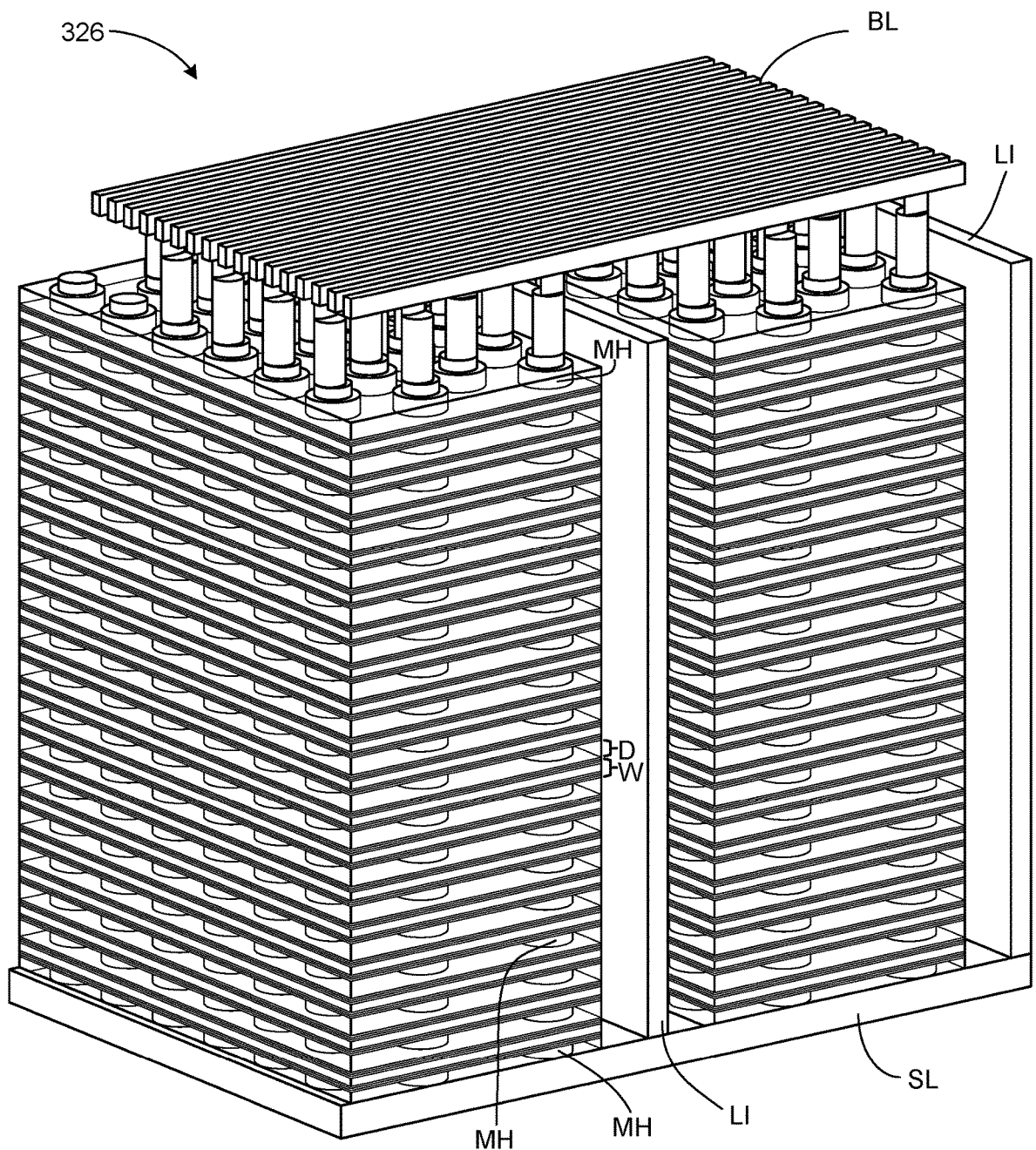
FIG. 3 is a perspective view of a portion of one embodiment of a monolithic three-dimensional memory structure.

FIG. 3 is a perspective view of a portion of one example embodiment of a monolithic three-dimensional memory array that can comprise memory structure 326, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers.

More or fewer than 108-278 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory array that comprises memory structure 326 is provided below with respect to FIG. 4A-4C.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

Figure 4B:
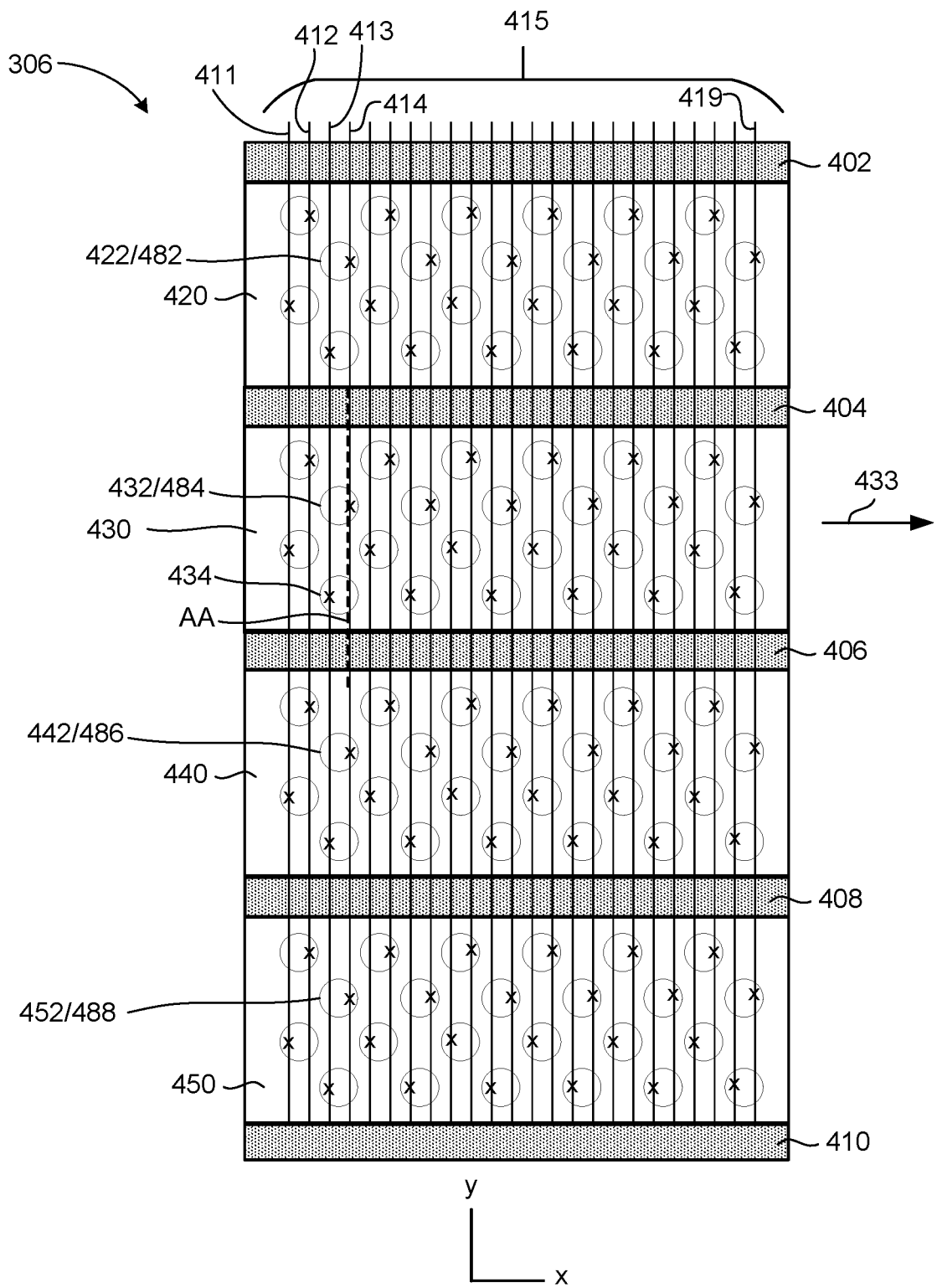
FIG. 4B depicts a top view of a portion of a block of memory cells.
Figure 4C:
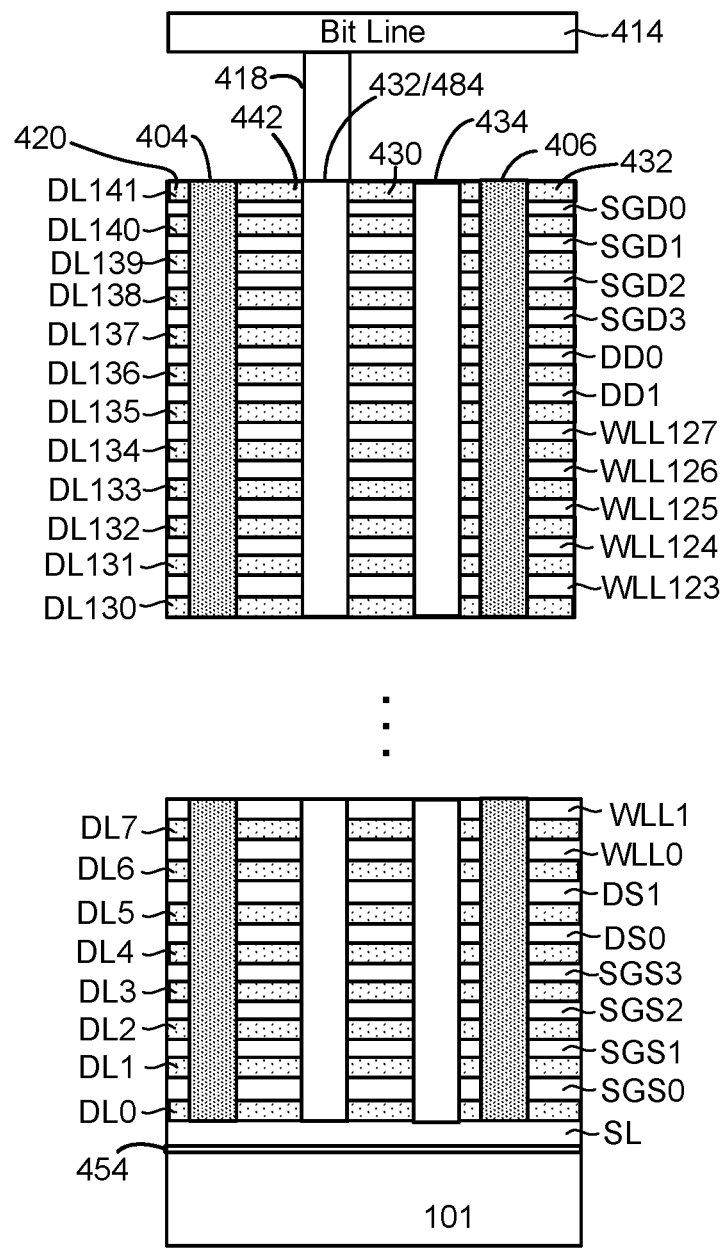
FIG. 4C depicts a cross sectional view of a portion of a block of memory cells.

FIGS. 4B-4C depict an example three dimensional ("3D") NAND structure. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 433. In one embodiment, the memory array has sixty layers. Other embodiments have less than or more than sixty layers. However, FIG. 4B only shows the top layer.

FIG. 4B depicts a plurality of circles that represent the vertical columns. Each of the vertical columns include multiple select gates (also referred to as a select transistors) and multiple memory cells (also referred to as data memory cells). In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B FIG. 4B also depicts a set of bit lines 415, including bit lines 411, 412, 413, 414, ... 419. FIG. 4B shows twenty-four bit lines because only a portion of the block is depicted. It is contemplated that more than twenty-four bit lines may be connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

FIG. 4C depicts a portion of one embodiment of a three-dimensional memory structure 326 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3 associated with the drain side select gates; four source side select layers SGS0, SGS1, SGS2 and SGS3 associated with the source side select gates; four dummy word line layers DD0, DD1, DS0 and DS1; and forty-eight data word line layers WLL0-WLL127 for connecting to data memory cells. Other embodiments can implement more or less than four drain side select layers, more or less than four source side select layers, more or less than four dummy word line layers, and more or less than one hundred and twenty eight word line layers. Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 418. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL141. For example, dielectric layers DL131 is above word line layer WLL123 and below word line layer WLL124. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Although the example memory system of FIGS. 3-4C is a three-dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

Figure 5:
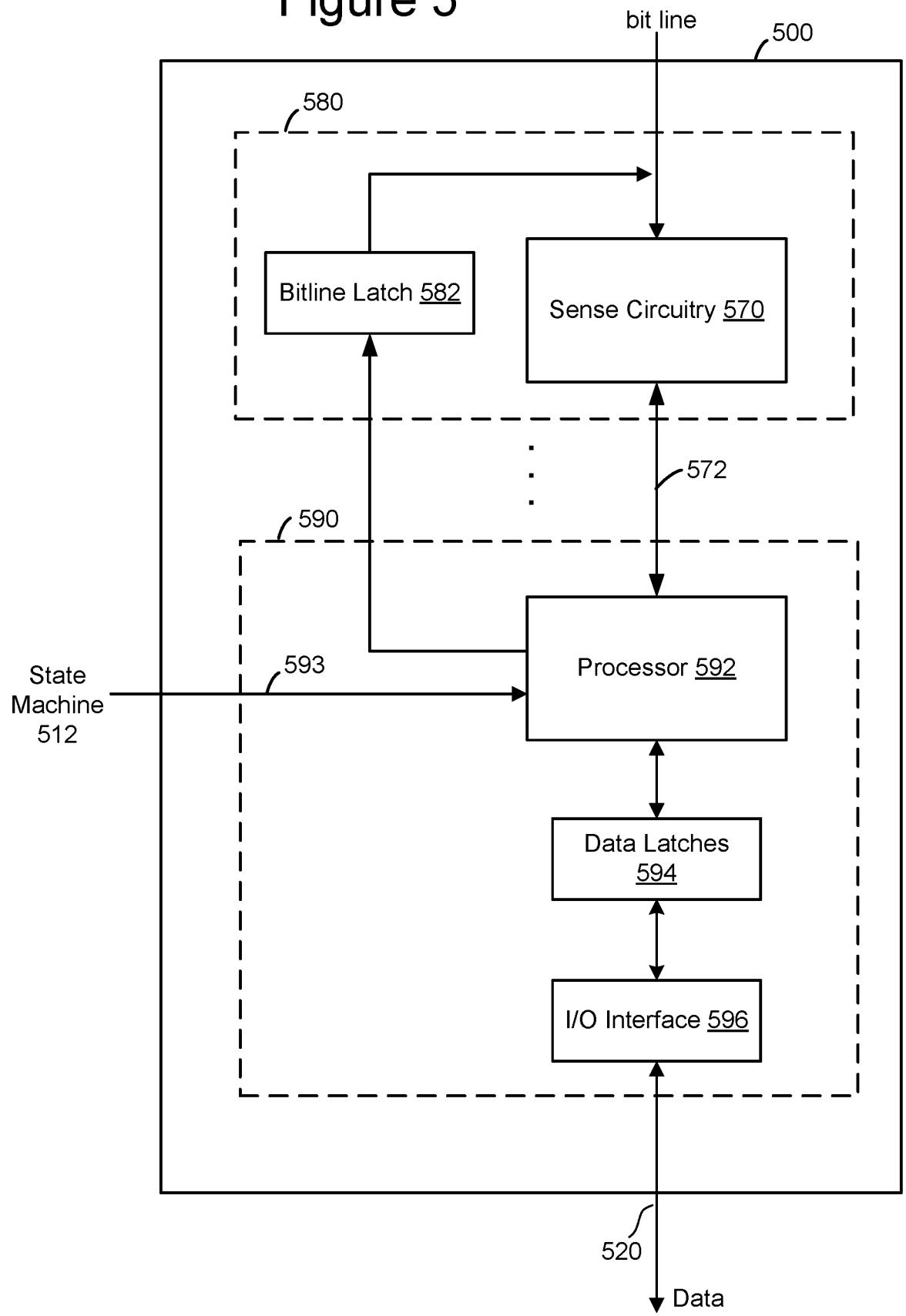
FIG. 5 shows an example of a sense block.

FIG. 5 depicts one embodiment of a sense block 500, such as sense block 350 in FIG. 2. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. Processor 592 may also move data between latches and perform operations on data in latches (e.g., performing logic operations such as Exclusive OR (XOR) operations. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latches 594 include a stack of data latches corresponding to the sense module. In one embodiment, there are three or more data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 6:
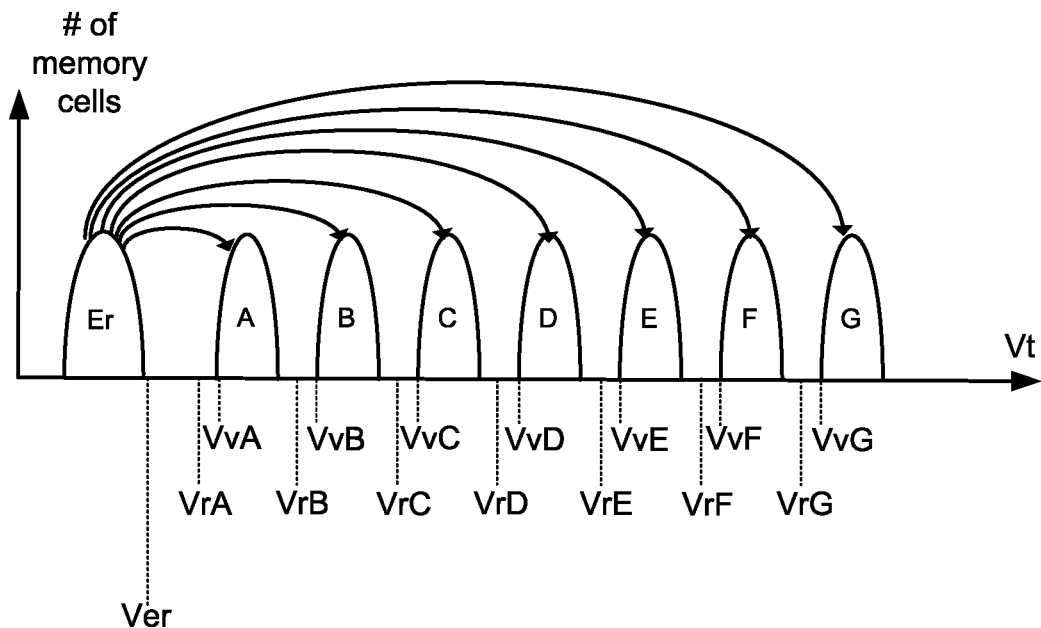
FIG. 6 shows multiple data states of nonvolatile memory cells.

FIG. 6 illustrates an example threshold voltage distributions for the memory array when each memory cell stores three bits of data. Other embodiments, however, may use other data capacities per memory cell (e.g., such as one, two, four, or five bits of data per memory cell). Storing more than one bit of data per memory cell is referred to as Multi-Level Cell (MLC). Storing one bit of data per memory cell is referred to a Single-Level Cell (SLC). FIG. 6 shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits.

FIG. 6 shows seven verify reference voltages, VvA, VvB, VvC, VvD, VvE, VvF, and VvG. When programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC, and so on up to state G. FIG. 6 also shows Ver, which is a voltage level to test whether a memory cell has been properly erased.

FIG. 6 also shows seven read reference voltages, VrA, VrB, VrC, VrD, VrE, VrF, and VrG for reading data from memory cells. By testing whether the threshold voltage of a given memory cell is above or below the seven read reference voltages (e.g., performing sense operations using a sense block such as sense block 350), the system can determine what data state (e.g., Er, A, B, C, . . . ) a memory cell is in. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

Although FIG. 6 shows the Vt distributions as non-overlapping, there may be some overlap between adjacent Vt distributions. Over time, effects such as read disturb and data retention may change the shape of the Vt distributions. In some examples, the amount of charge in nearby non-volatile memory cells (e.g., along neighboring word lines) may also affect Vt distributions.

Figure 7:
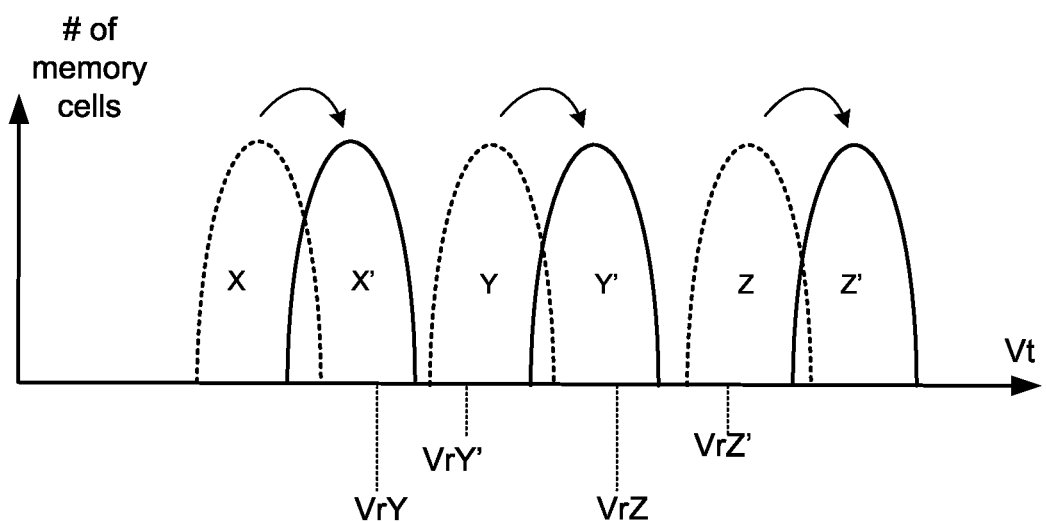
FIG. 7 shows an example of changing distributions of data states.

FIG. 7 shows an example of how threshold voltages of memory cells may be shifted as a result of one or more effects. Three adjacent distributions corresponding to any three data states (e.g., data states of FIG. 6, or other data states) are shown before shifting as initial distributions X, Y, and Z and after shifting as shifted distributions X', Y', and Z'. For example, threshold voltages may shift as a result of programming of one or more nearby non-volatile memory cell (e.g., non-volatile memory cell of an adjacent word line). It can be seen that read voltages that may be optimized for reading initial distributions X, Y, Z (e.g., read voltages VrY and VrZ) may not be optimized for shifted distributions VrY', Y', Z'. For example, while read voltage VrY lies between original distributions X and Y, after shifting occurs (e.g., as a result of programming of nearby memory cells), read voltage VrY does not lie between shifted distributions X' and Y'. Instead, VrY lies within shifted distribution X' so that using this read voltage would result in a significant number of memory cells that were programmed to distribution X (shifted to X') being read as being in distribution Y. This could result in a significant number of errors (e.g., more than can be corrected by Error Correction Code (ECC) resulting in a failure to read user data). Similarly, read voltage VrZ may no longer be optimized for reading shifted distribution Z' because a significant portion of distribution Y' lies above VrZ corresponding to a significant number of errors. Any distribution may be misread as a result of such threshold voltage shifts. Such shifts may be more significant for certain threshold voltage ranges (e.g., for certain data states) and where higher numbers of bits are stored using narrower threshold voltage ranges.

FIG. 7 shows second read voltages VrY' and VrZ', which are suitable for reading shifted distributions Y' and Z'. For example, second read voltage VrY' lies between distributions X' and Y' while second read voltage VrZ' lies between distributions Y' and Z'. Thus, using second read voltages VrY' and VrZ' instead of first read voltages VrY and VrZ may be better (result in fewer errors) after threshold voltage shifting has occurred. Selecting appropriate read voltages to compensate for threshold voltage shifts (e.g., selecting VrY' and VrZ' appropriately) may provide significant benefits by reducing the number of errors in data that is read after such shifting has occurred. Appropriate read voltages may depend on the amount of threshold voltage shifting that has occurred, which may in turn depend on how much charge is present in one or more nearby non-volatile memory cells (e.g., non-volatile memory cells of one or more adjacent word line). For example, while one shifted distribution is shown for each initial distribution, different distributions may result from different amounts of charge in nearby non-volatile memory cells so that different read voltages may be appropriate.

It may be challenging to accurately compensate for such effects for different non-volatile memory cells that may have neighboring non-volatile memory cells with widely varying amounts of charge due to different data states. For example, some non-volatile memory cells may have one or more neighboring non-volatile memory cell that is programmed with a large amount of charge (e.g., distribution F or G of FIG. 6) while other non-volatile memory cells may have one or more neighbor with a small amount of charge (e.g., distributions Er or A of FIG. 6).

Figure 8A:
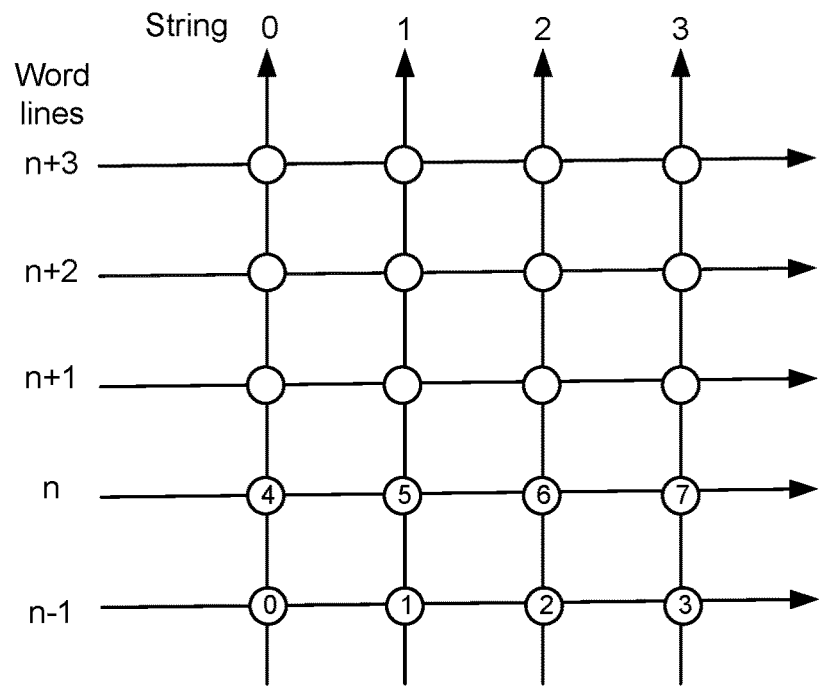
FIGS. 8A-B illustrate examples of word line programming.

FIG. 8A shows an example of word lines n−1 to n+3 and strings 0 to 3 in a portion of a non-volatile memory array (e.g., in memory structure 326) in which word lines n−1 to n have been programmed and word lines n+1 to n+3 have not been programmed (i.e., non-volatile memory cells of word lines n+1 to n+3 are in an erased condition). In some examples, programming may follow a predetermined programming order and the numbering of word lines in the present example indicate the order of programming (i.e., programming starts along word line n−1 going in order from string 0 to string 3). The programming order is from bottom to top in this example (i.e., starting at the lowest word line and moving up). Each word line is programmed in order from string 0 to string 3 with numbers at each node indicating the order of programming. Because programming of memory cells along word line n+1 has not occurred in the scenario shown, read voltages used to read non-volatile memory cells of word line n (the target word line for a read operation) may be based on the amount of charge of non-volatile memory cells of word line n−1 only (not word line n+1).

Figure 8B:
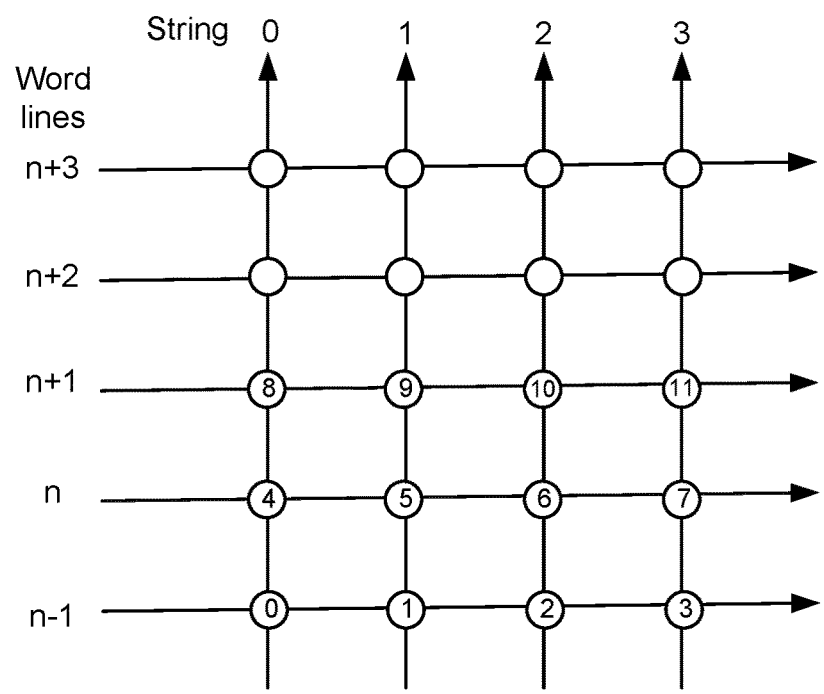

FIG. 8B shows an example in which word lines n−1 to n+1 have been programmed and word lines n+2 to n+3 have not been programmed (e.g., after programming has continued from the scenario shown in FIG. 8A as indicated by the numbers at each node). Because non-volatile memory cells of word line n+1 have been programmed at this point and may affect non-volatile memory cells of target word line n, read voltages used to read non-volatile memory cells of word line n may be based on the amount of charge of non-volatile memory cells of word line n+1.

In some cases, the amount of charge in non-volatile memory cells of neighboring word lines on either side of a target word line may be used to determine read voltages to use to read non-volatile memory cells of the target word line (e.g., charge in non-volatile memory cells of both neighboring word lines, n−1 and n+1, may be used). However, such a determination may take significant time and it may be advantageous to base read voltages on a single neighboring word line. In some cases, when a subsequent word line in the programming order has been programmed, it may be advantageous (e.g., result in fewer errors) to use the subsequent word line to determine read voltages (e.g., once word line n+1 is programmed as shown in FIG. 8B, it may be better to use word line n+1 to determine read voltages for reading word line n). When the subsequent word line in programming order has not yet been programmed, it may be advantageous (e.g., result in fewer errors) to use the prior word line in programming order to determine read voltages (e.g., in FIG. 8A, it may be advantageous to use word line n−1 to determine read voltages to read word line n). Which neighboring word line to use for such a single word line based selection may be significant (e.g., the number of errors may be reduced by selecting appropriately).

Figure 9A:
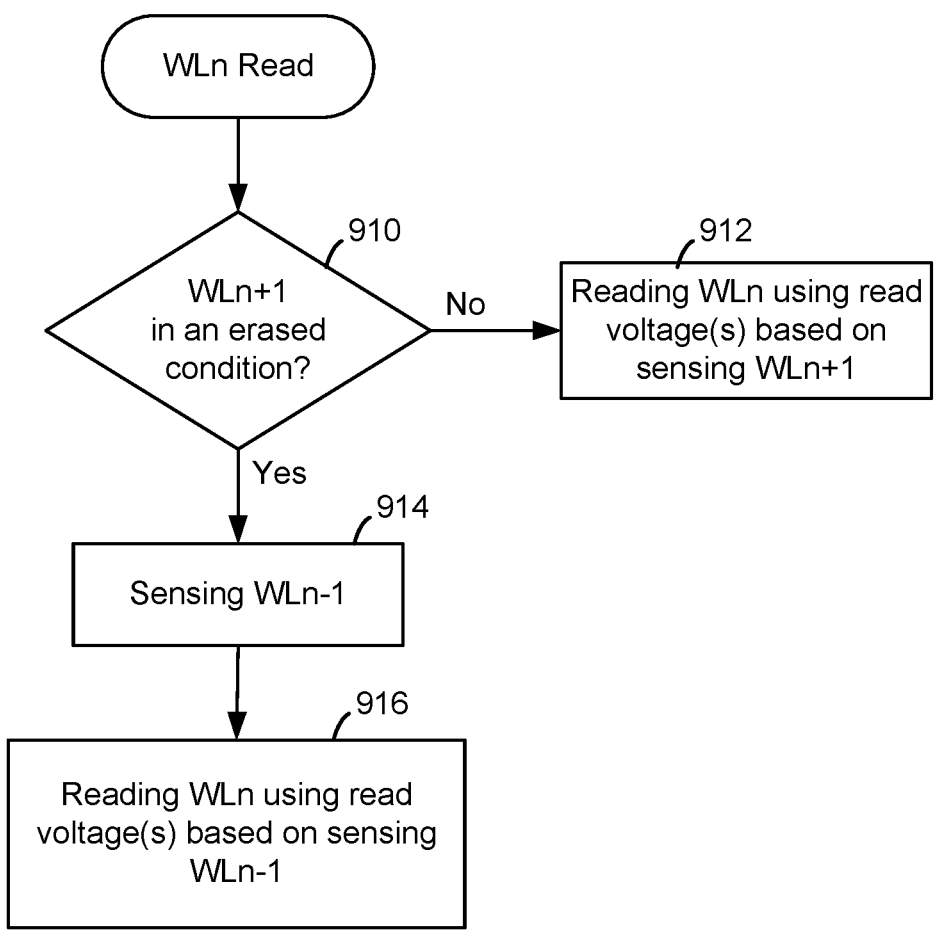
FIGS. 9A-C illustrate examples of read operations with read voltage(s) selected according to a selected neighboring word line.

FIG. 9A illustrates a method of reading a target word line WLn (e.g., word lines n of FIGS. 8A-B) according to an example of the present technology. The method includes determining whether WLn+1 (subsequent word line in programming order, which may be physically located immediately above WLn) is in an erased condition 910. If WLn+1 is not in an erased condition (e.g., has been programmed as shown in FIG. 8B) the method includes reading WLn using one or more read voltage(s) based on sensing WLn+1 912 (e.g., sensing to determine an amount of charge present in non-volatile memory cells of WLn+1). In some cases, sensing WLn+1 may include a separate sensing step (read step). In other cases, determining whether WLn+1 is erased and sensing WLn+1 may be combined (e.g., a single sensing step may be used to determine if WLn+1 is in an erased condition and also determine whether threshold voltage and stored charge of non-volatile memory cells of WLn+1 exceed a predetermined level). If WLn+1 is determined to be in an erased condition at step 910, the method includes sensing WLn−1 914 and reading WLn using one or more read voltage based on sensing WLn−1. It can be seen that using this method, if WLn+1 is programmed (not erased) then WLn−1 is not accessed and appropriate read voltage(s) may be rapidly obtained.

Figure 9B:
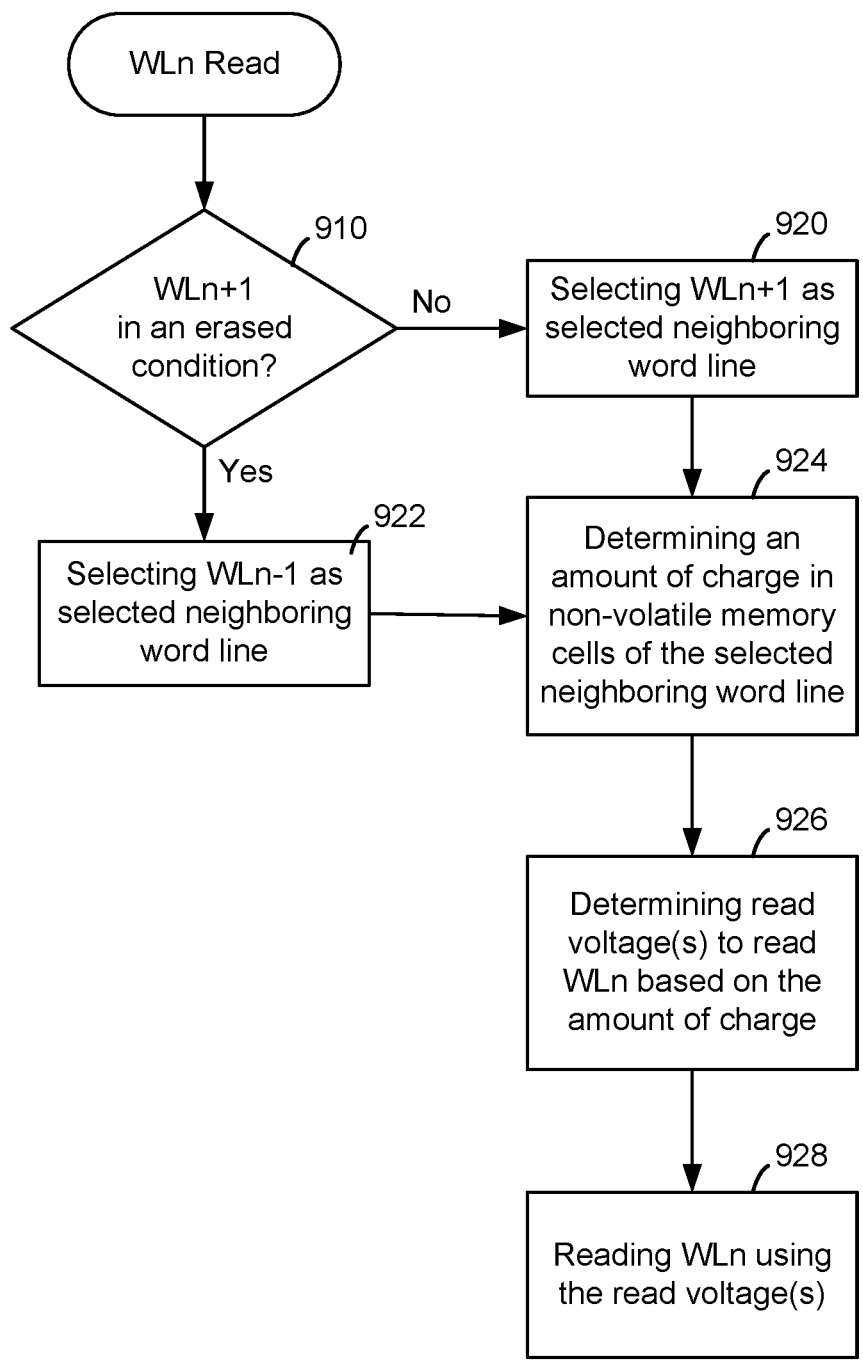

FIG. 9B illustrates a method that is similar to the method of FIG. 9A and includes the determination as to whether WLn+1 is in an erased condition 910. If WLn+1 is not in an erased condition the method includes selecting WLn+1 as a selected neighboring word line 920 and alternatively, if WLn+1 is in the erased condition, selecting WLn−1 as a selected neighboring word line 922. The method further includes determining an amount of charge in non-volatile memory cells of the selected neighboring word line 924 (e.g., either WLn+1 or WLn−1 depending on the outcome of step 910), determining read voltage(s) to read WLn based on the amount of charge 926, and reading WLn using the read voltage(s) 928. Thus, a single neighboring word line is selected to determine appropriate read voltage(s) for reading a target word line, with the selected neighboring word line chosen according to whether the target word line (WLn) is the last programmed word line in programming order (WLn+1 erased) or not the last programmed word line (WLn+1 programmed).

As before, when WLn+1 is not in an erased condition and WLn+1 is selected as the neighboring word line to use, determining the amount of charge in non-volatile memory cells of WLn+1 may be achieved from a common sensing step with the determination that WLn+1 is not erased. For example, sensing at a single read voltage may be sufficient to determine that WLn+1 is written and whether non-volatile memory cells along WLn+1 have threshold voltages above or below the read voltage and thus whether the memory cells have an amount of charge above or below a predetermined amount.

In one example, two different read voltages may be used to read a given data state of non-volatile memory cells of a target word line depending on whether corresponding non-volatile memory cells of the selected neighboring word line have an amount of charge above or below a predetermined level (e.g., high and low read voltages according to high and low levels of charge in neighboring non-volatile memory cells). In another example, three or more different read voltages may be used for a given data state based on a higher resolution evaluation of charge level of a neighboring non-volatile memory cell (e.g., low, medium, and high read voltages corresponding to low, medium, and high levels of charge). Reading of each data state may use the same number of read voltages or different numbers may be used for different data states (e.g., some data states may have less disturbance and may be read using a single read voltage while other data states may have more disturbance and may be read using two or more read voltages).

Figure 9C:
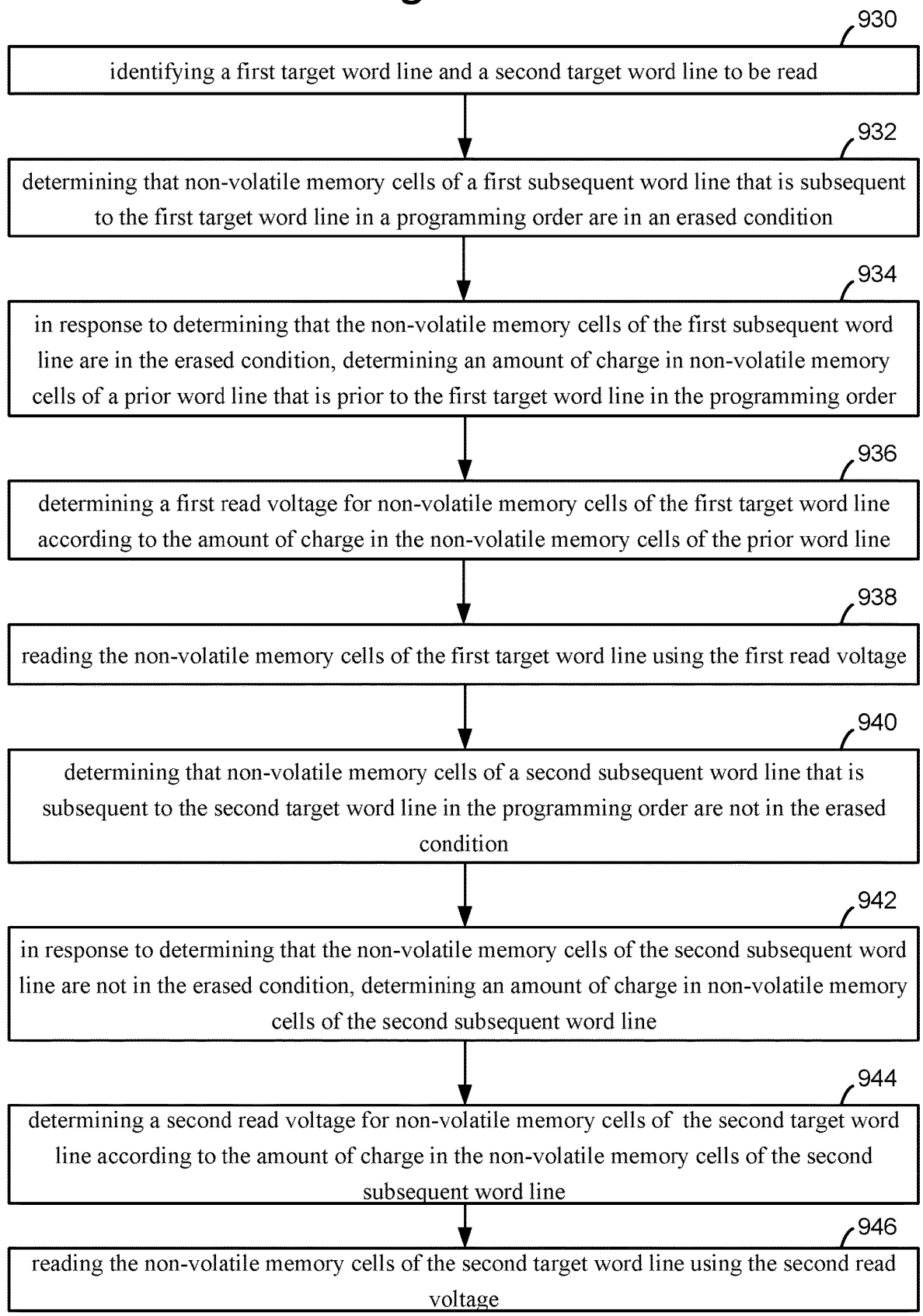

FIG. 9C illustrates an example of a method according to the present technology applied to two target word lines that are read using different selected neighboring word lines. The method includes identifying a first target word line and a second target word line to be read 930, determining that non-volatile memory cells of a first subsequent word line that is subsequent to the first target word line in a programming order are in an erased condition 932 (e.g., WLn+1 erased as in FIG. 8A), in response to determining that the non-volatile memory cells of the first subsequent word line are in the erased condition, determining an amount of charge in non-volatile memory cells of a prior word line that is prior to the first target word line in the programming order 934 (e.g., WLn−1), determining a first read voltage for non-volatile memory cells of the first target word line according to the amount of charge in the non-volatile memory cells of the prior word line 936, and reading the non-volatile memory cells of the first target word line using the first read voltage 938. The method further includes determining that non-volatile memory cells of a second subsequent word line that is subsequent to the second target word line in the programming order are not in the erased condition 940 (e.g., WLn+1 not erased as in FIG. 8B), in response to determining that the non-volatile memory cells of the second subsequent word line are not in the erased condition, determining an amount of charge in non-volatile memory cells of the second subsequent word line 942, determining a second read voltage for non-volatile memory cells of the second target word line according to the amount of charge in the non-volatile memory cells of the second subsequent word line 944; and reading the non-volatile memory cells of the second target word line using the second read voltage 946.

FIG. 10A shows a timing diagram to illustrate how aspects of the present technology (e.g., methods of FIGS. 9A-C) may be implemented to read non-volatile memory cells of a target word line WLn based on an appropriate selected neighboring word line (WLn−1 in this example, e.g., as illustrated in FIG. 8B). Voltages on a target word line, WLn, and neighboring word lines, WLn−1 and WLn+1, on either side are shown (where the order of programming is in ascending order WLn−1, WLn, WLn+1, and so on). The x-axis represents time while the y-axis shows voltage on each word line.

In a first sensing step (read step) from T0 to T1, WLn+1 is sensed to see if non-volatile memory cells are erased or programmed. A read pass voltage, Vread, is applied to WLn−1 and WLn while a read voltage SxR is applied to WLn+1. When it is found that non-volatile memory cells of WLn+1 are erased (not programmed) a second sensing step from T2 to T3 is checks the amount of charge in non-volatile memory cells of WLn−1. A read pass voltage, Vread, is applied to WLn and WLn+1 while the read voltage SxR is applied to WLn−1. Read voltage SxR may be selected to enable a determination of how much charge is stored in non-volatile memory cells of WLn−1, for example, above or below a predetermined level that corresponds to more or less effect on non-volatile memory cells of target word line WLn. Thus, the results of this sensing step may be a mapping that indicates the amount of charge in non-volatile memory cells along WLn−1 and appropriate read voltage(s) to use for reading corresponding non-volatile memory cells along WLn. Subsequently, when WLn is read (from T4 to T13) different read voltages may be used for different non-volatile memory cells according to the mapping that reflects the amount of charge found in corresponding non-volatile memory cells of WLn−1.

FIG. 10A shows reading of three data states: C, B, and A. A single sensing step is used to read data state C by applying read voltage VrC from T4 to T5. Reading of all non-volatile memory cells along WLn may be enabled from T4 to T5. Subsequently, two sensing steps are used to read data state B. A first sensing step from T6 to T7 applies read voltage VrB' and a second sensing step from T8 to T9 applies read voltage VrB, which is lower than VrB' (e.g., see VrY and VrY' of FIG. 7). Depending on the amount of charge found in neighboring non-volatile memory cell along WLn−1, a non-volatile memory cell along WLn may be read using either VrB or VrB'. For example, for non-volatile memory cells along WLn having neighboring non-volatile memory cells along WLn−1 with a high level of charge (as determined by sensing from T2 to T3) may be read from T6 to T7 using VrB' while non-volatile memory cells along WLn having neighboring non-volatile memory cells along WLn−1 with a low level of charge (as determined by sensing from T2 to T3) may be read from T8 to T9 using VrB. Similarly, reading of data state A uses two sensing steps with two read voltages VrA' and VrA. Depending on the amount of charge found in neighboring non-volatile memory cell along WLn−1, a non-volatile memory cell along WLn may be read using either VrA or VrA'. For example, for non-volatile memory cells along WLn having neighboring non-volatile memory cells along WLn−1 with a high level of charge (as determined by sensing from T2 to T3) may be read from T10 to T11 using VrA' while non-volatile memory cells along WLn having neighboring non-volatile memory cells along WLn−1 with a low level of charge (as determined by sensing from T2 to T3) may be read from T12 to T13 using VrA. Because non-volatile memory cells along WLn+1 were found to be erased, the condition of non-volatile memory cells along WLn+1 is not used in selecting between different read voltages in this example.

Figure 10B:
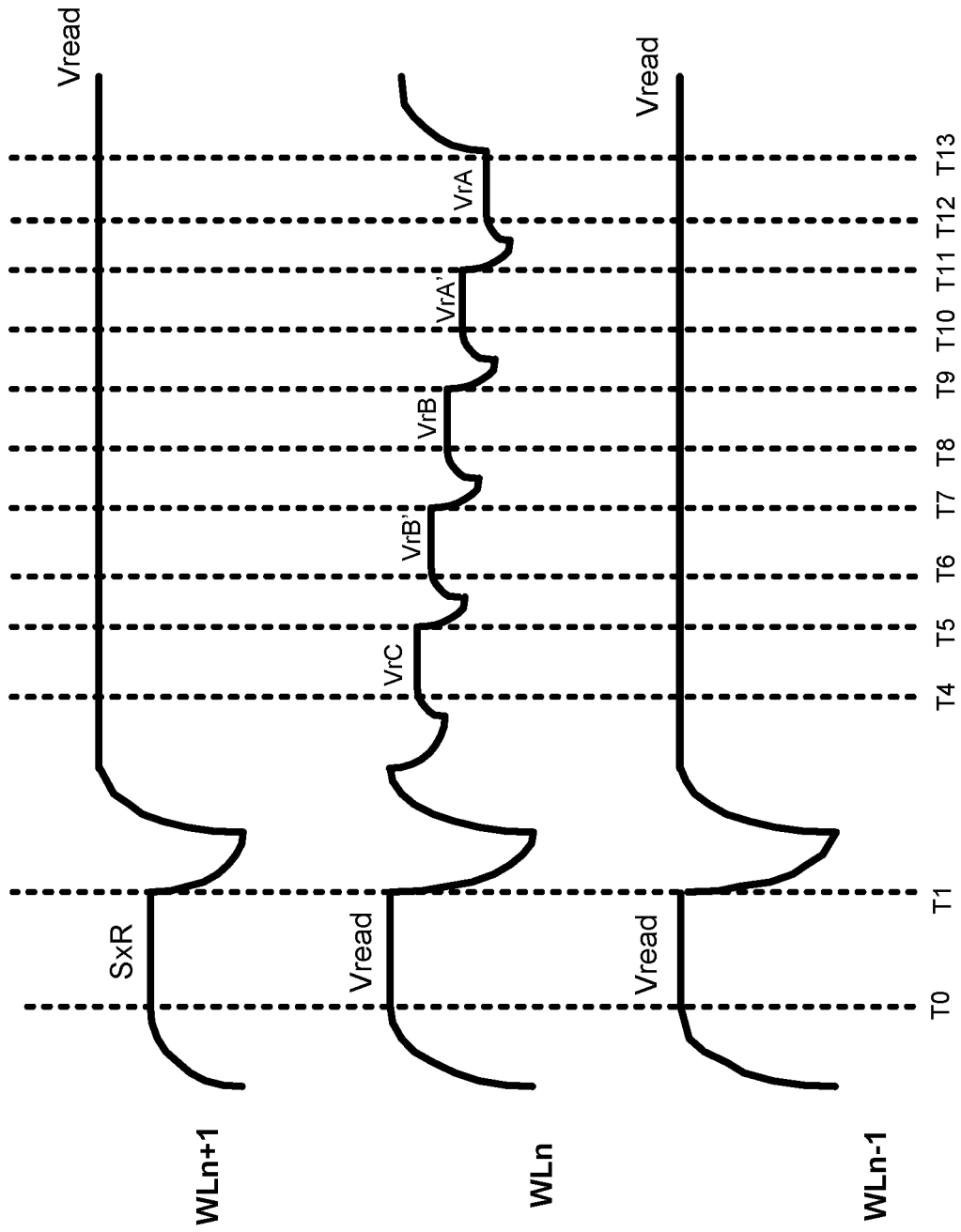

FIG. 10B illustrates an example of reading another word line that has programmed neighboring word lines on both sides (e.g., WLn+1 is programmed and WLn is not the last programmed word line as illustrated in FIG. 8B). In this example, WLn+1 is sensed as before from T0 to T1. However, in this case, it is determined from this sensing that WLn+1 is not erased and therefore WLn+1 is chosen as the selected neighboring word line to use to determine read voltage(s). The results of sensing WLn+1 from T0 to T1 may be a mapping that indicates the threshold voltages and amounts of charge of non-volatile memory cells along WLn+1 (similarly to sensing of WLn−1 from T2 to T3 of FIG. 10A) so that non-volatile memory cells are grouped into those with high levels of charge and lower levels of charge. These levels of charge in the mapping may then be used to determine which of two or more read voltage to use when reading corresponding non-volatile memory cells along WLn (e.g., to determine a corresponding mapping of read voltages). WLn−1 is not sensed in this example because WLn+1, not WLn−1, is the selected neighboring word line. The subsequent reading of WLn from T4 to T13 is similar to the previous example, except that the selection of which read voltage to use for a given non-volatile memory cell is based on charge levels along WLn+1 (found from T0 to T1) and not WLn−1. For any given non-volatile memory cell along WLn, this may produce a different result (e.g., a non-volatile memory cell on one side may have a high level of charge while a non-volatile memory cell on the other side may have a low level of charge).

A memory system such as memory system 100 may be configured to implement aspects of the examples described above. For example, controller 102 and/or control circuits 310 may be configured to identify which neighboring word line to select and to determine one or more read voltage accordingly. Thus, controller 102 and/or control circuits 310 in combination with read/write circuits 328 may be considered an example of means for reading a plurality of non-volatile memory cells by, for each word line to be read, identifying either a prior word line or a subsequent word line in a programming order as a selected neighboring word line based on whether non-volatile memory cells of the subsequent word line are in an erased condition, and determining a read voltage for non-volatile memory cells of each word line to be read according to an amount of charge in non-volatile memory cells of a corresponding selected neighboring word line.

A read operation according to any of the present examples may be applied to any word line including word lines that are fully programmed (e.g., with four bits per cell represented by sixteen data states in what may be referred to as a Quad Level Cell or QLC configuration) and word lines that are partially programmed (e.g., with two bits per cell represented by four data states in what may be referred to as an example of MLC). In some examples, word lines are partially programmed initially (e.g., to store a first number of bits per cell) and are subsequently fully programmed (to store a second, larger number of bits per cell) only after one or more neighboring word line is programmed (e.g., partially programmed to store partial data). For example, non-volatile memory cells along WLn may be partially programmed in a first programming operation. Then, WLn+1 may be partially programmed. Subsequently, WLn may be fully programmed in a second programming operation. This may reduce the impact of charge in non-volatile memory cells of WLn+1 when reading data stored in WLn. In some examples, data that is programmed in such partially programmed non-volatile memory cells may be stored or buffered in another location (e.g., in a volatile memory) until a second programming operation occurs. In other examples, programmed data stored in such cells is read from the word line where it is located and combined with additional data for fine programming (e.g., for fully programming both the additional data and the earlier data). In examples described here, non-volatile memory cells are first programmed to four data states in an MLC programming operation and are subsequently fine programmed to sixteen data states in a fine programming operation in what may be referred to as an MLC-fine programming scheme. In open blocks using MLC-fine programming, reading of MLC programmed data is common. Because such data may not be stored elsewhere it may be important to read it accurately.

Figure 11:
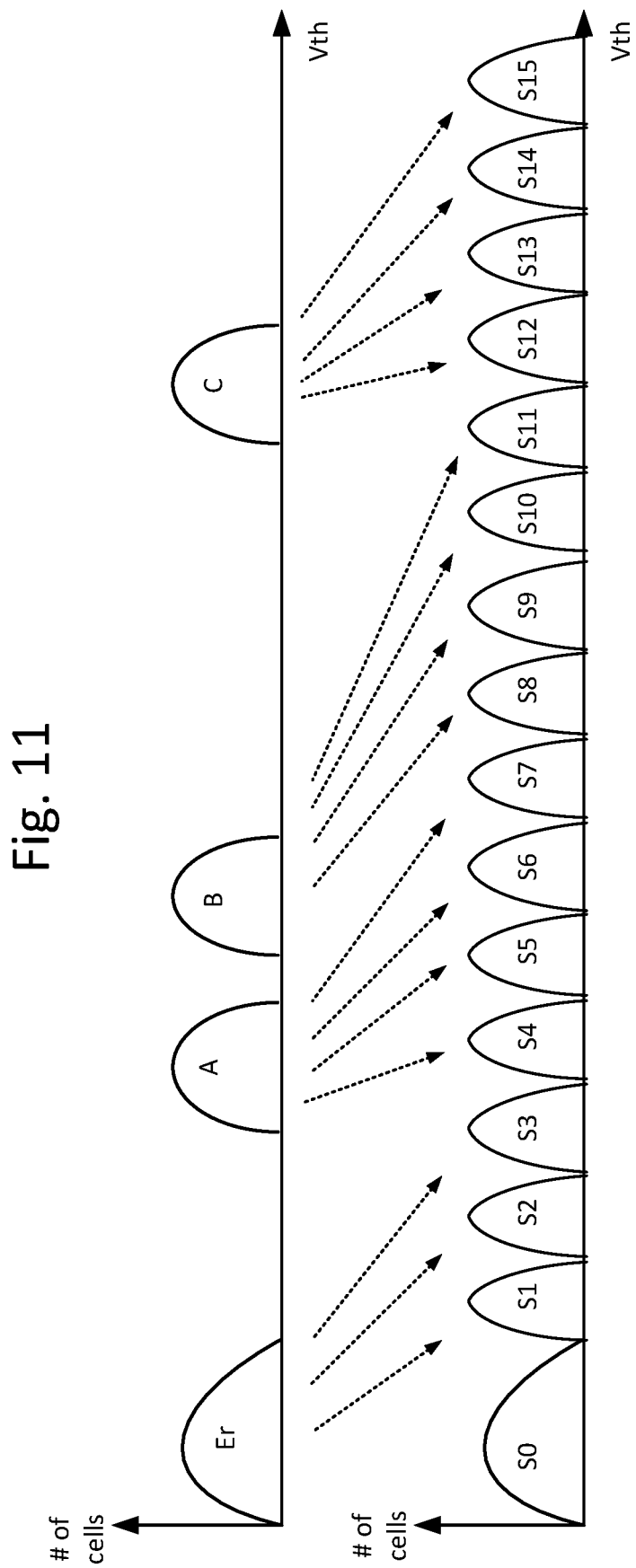
FIG. 11 illustrates an example of MLC-fine programming.

FIG. 11 shows an example of MLC-fine programming for QLC memory cells that are initially programmed into four data states, Er, A, B, and C, roughly corresponding to data states S0, S4, S6, and S12. The top portion of FIG. 11 shows distributions Er, A, B, and C resulting from MLC programming while the bottom portion shows distributions S0 to S15 resulting from subsequent fine programming and shows the correspondence between MLC and fine data states. MLC programmed data uses the four data states Er, A, B, and C to represent two bits of data while fine programmed data uses the sixteen data states S0-S15 to represent four bits of data. Non-volatile memory cells are MLC programmed with two bits of data and subsequently fine programmed with two additional bits of data using an appropriate encoding scheme. Prior to fine programming, MLC programmed data may be read (e.g., by sensing to identify non-volatile memory cells in data states Er, A, B, and C) to obtain two bits of data and then the non-volatile memory cells may be further programmed with two additional bits of data (further programmed from data states Er, A, B, and C to data states S0-S15). Misreading MLC programmed data may result in fine programming to the wrong data states.

FIG. 12 shows an example of reading MLC programmed data (e.g., as shown in the top portion of FIG. 11) using three read voltages, VrA, VrB, and VrC with an example encoding scheme illustrated that assigns two bits to each data state (data state Er: 11; data state A: 10; data state B: 00; and data state C: 01). It can be seen that there is a wide separation between distributions of data states B and C so that a single read voltage may be sufficient (e.g., as illustrated in FIGS. 10A-B) while there is less separation between distributions of data states Er, A, and B, so that it may be beneficial to use two or more read voltages to compensate for charge in non-volatile memory cells of a neighboring word line. For example, FIGS. 10A-B show two read voltages to sense data state A (VrA and VrA') and two read voltages to read data state B (VrB and VrB'). In other examples, a single read voltage VrA may be used for data state A because there is a larger separation between distributions of data states Er and A than A and B. In this case, only data state B may be read using two read voltages (VrB and VrB') in some examples.

Suitable read voltages for determining whether non-volatile memory cells of a given word line are erased (e.g., step 910) and how much charge is present may be selected according to the data states and corresponding distributions in use. For example, a read voltage between data states B and C (e.g., VrC) may be used to determine whether non-volatile memory cells are erased. If the non-volatile memory cells of the word line are erased, then their threshold voltages will be below VrC. Such a predetermined read voltage may also be used to determine the amount of charge stored in non-volatile memory cells along a selected neighboring word line for purposes of adjusting read voltages. For example, non-volatile memory cells having a threshold voltage above VrC may be considered to have a large amount of charge (high charge level) while non-volatile memory cells having a threshold voltage below VrC may be considered to have a small amount of charge (low charge level) and appropriate read voltages may be selected accordingly. Thus, a read voltage between distributions of data states B and C (e.g., VrC) may be used as SxR in FIGS. 10A-B. While this example uses a single read voltage to group non-volatile memory cells into two groups according to charge levels, other examples may use more than one read voltage to group non-volatile memory cells into three or more groups according to charge levels and may apply three or more different read voltages accordingly.

Examples of the present technology may be applied universally or selectively in a memory array. For example, when it is known that a word line to be read does not have an erased neighboring word line (e.g., a word line in a fully written block) it may be unnecessary to sense the subsequent word line in programming order to determine if it is erased. For word lines that do not have neighboring word lines on either side (e.g., top and bottom word lines) read voltages may be based only on the neighboring word line that is present. In some cases, examples of the present technology may be selectively applied to particular word lines or particular blocks that are found to have a high error rate. For example, a memory controller may enable use of multiple read voltages based on a selected neighboring word line in a given block in response to a Bit Error Rate (BER) of the block exceeding a threshold BER or based on some other criteria. Thus, some blocks may use a single read voltage to read a given data state while other blocks in the same array may use two or more read voltages to read the same data state.

An example of an apparatus includes one or more control circuits configured to connect to a plurality of non-volatile memory cells through a plurality of word lines. The one or more control circuits are configured to: for each target word line of a plurality of target word lines to be read, select either a first neighboring word line or a second neighboring word line as a selected neighboring word line according to whether non-volatile memory cells of the first neighboring word line are in an erased condition, and determine a read voltage to read non-volatile memory cells of a corresponding target word line according to an amount of charge in non-volatile memory cells of the selected neighboring word line.

The one or more control circuits may be further configured to select the first neighboring word line as the selected neighboring word line in response to non-volatile memory cells of the first neighboring word line not being in the erased condition and select the second neighboring word line as the selected neighboring word line in response to non-volatile memory cells of the first neighboring word line being in the erased condition. The one or more control circuits may be further configured to program non-volatile memory cells of word lines in a predetermined order and the first neighboring word line is immediately after a corresponding selected word line in the predetermined order. The second neighboring word line may be immediately prior to a corresponding selected word line in the predetermined order. The one or more control circuits may be further configured to determine the amount of charge in non-volatile memory cells of the selected neighboring word line by performing a read step at a single predetermined read voltage. The one or more control circuits may be further configured to select a first read voltage to apply in response to determining that the amount of charge is below a predetermined amount and to select a second read voltage to apply in response to determining that the amount of charge is above the predetermined amount. The first read voltage may be lower than the second read voltage. The one or more control circuits may be configured to program non-volatile memory cells in a first operation and further program the non-volatile memory cells in a second operation and one or more of the plurality of target word lines may have non-volatile memory cells programmed in a first operation and not programmed in a second operation. The one or more control circuits may be further configured to read the corresponding target word line using the read voltage to obtain partial data programmed in the first operation and to use the partial data to further program the non-volatile memory cells in the second operation. The plurality of non-volatile memory cells may be located in a three-dimensional memory structure, the first neighboring word line immediately above the corresponding target word line and the second neighboring word line immediately below the corresponding target word line.

An example of a method includes identifying a first target word line and a second target word line to be read; determining that non-volatile memory cells of a first subsequent word line that is subsequent to the first target word line in a programming order are in an erased condition; in response to determining that the non-volatile memory cells of the first subsequent word line are in the erased condition, determining an amount of charge in non-volatile memory cells of a prior word line that is prior to the first target word line in the programming order; determining a first read voltage for non-volatile memory cells of the first target word line according to the amount of charge in the non-volatile memory cells of the prior word line; reading the non-volatile memory cells of the first target word line using the first read voltage; determining that non-volatile memory cells of a second subsequent word line that is subsequent to the second target word line in the programming order are not in the erased condition; in response to determining that the non-volatile memory cells of the second subsequent word line are not in the erased condition, determining an amount of charge in non-volatile memory cells of the second subsequent word line; determining a second read voltage for non-volatile memory cells of the second target word line according to the amount of charge in the non-volatile memory cells of the second subsequent word line; and reading the non-volatile memory cells of the second target word line using the second read voltage.

Determining the amount of charge in non-volatile memory cells of the prior word line may include sensing the non-volatile memory cells of the prior word line while applying a predetermined read voltage on the prior word line and determining the amount of charge in non-volatile memory cells of the second subsequent word line may include sensing the non-volatile memory cells of the second subsequent word line while applying the predetermined read voltage on the second subsequent word line. The amount of charge in the non-volatile memory cells of the prior word line may be determined to be less than a threshold amount, the amount of charge in the non-volatile memory cells of the second subsequent word line may be determined to be more than the threshold amount, and the first read voltage may be lower than the second read voltage. The method may further include determining a first mapping of read voltages including the first read voltage to non-volatile memory cells for reading non-volatile memory cells of the first target word line; reading the non-volatile memory cells of the first target word line using the first mapping of read voltages to obtain two or more bits of data; determining a second mapping of read voltages including the second read voltage to non-volatile memory cells for reading non-volatile memory cells of the second target word line; and reading the second target word line using the second mapping of read voltages to obtain two or more bits of data. The method may further include subsequently additionally programming the first target word line and the second target word line. Additionally programming the first target word line and the second target word line includes programming non-volatile memory cells to data states that represent the two or more bits of data in combination with one or more additional bits of data. The two or more bits of data may consist of two bits of data represented by four data states and the two or more bits of data in combination with the one or more additional bits of data may consist of four bits of data represented by sixteen data states. Determining that the non-volatile memory cells of the second subsequent word line are not in the erased condition may include sensing at a predetermined read voltage, the sensing further used to determine the amount of charge in the non-volatile memory cells of the second subsequent word line.

An example of a data storage system includes a plurality of non-volatile memory cells coupled to a plurality of word lines; and means for reading the plurality of non-volatile memory cells by, for each word line to be read, identifying either a prior word line or a subsequent word line in a programming order as a selected neighboring word line based on whether non-volatile memory cells of the subsequent word line are in an erased condition, and determining a read voltage for non-volatile memory cells of each word line to be read according to an amount of charge in non-volatile memory cells of a corresponding selected neighboring word line.

The plurality of non-volatile memory cells may be configured for programming into four data states representing two bits of data in a first programming operation and subsequent programming into sixteen data states representing the two bits of data and an additional two bits of data in a second programming operation.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a plurality of non-volatile memory cells through a plurality of word lines,
the one or more control circuits are configured to:
for each target word line of a plurality of target word lines to be read, select either a first neighboring word line or a second neighboring word line as a selected neighboring word line according to whether non-volatile memory cells of the first neighboring word line are in an erased condition, and
determine a read voltage to read non-volatile memory cells of a corresponding target word line according to an amount of charge in non-volatile memory cells of the selected neighboring word line.

2. The apparatus of claim 1 wherein the one or more control circuits are further configured to select the first neighboring word line as the selected neighboring word line in response to non-volatile memory cells of the first neighboring word line not being in the erased condition and select the second neighboring word line as the selected neighboring word line in response to non-volatile memory cells of the first neighboring word line being in the erased condition.

3. The apparatus of claim 2, wherein the one or more control circuits are further configured to program non-volatile memory cells of word lines in a predetermined order and the first neighboring word line is immediately after a corresponding selected word line in the predetermined order.

4. The apparatus of claim 3, wherein the second neighboring word line is immediately prior to a corresponding selected word line in the predetermined order.

5. The apparatus of claim 1, wherein the one or more control circuits are further configured to determine the amount of charge in non-volatile memory cells of the selected neighboring word line by performing a read step at a single predetermined read voltage.

6. The apparatus of claim 5, wherein the one or more control circuits are further configured to select a first read voltage to apply in response to determining that the amount of charge is below a predetermined amount and to select a second read voltage to apply in response to determining that the amount of charge is above the predetermined amount.

7. The apparatus of claim 6, wherein the first read voltage is lower than the second read voltage.

8. The apparatus of claim 1, wherein the one or more control circuits are configured to program non-volatile memory cells in a first operation and further program the non-volatile memory cells in a second operation and wherein one or more of the plurality of target word lines has non-volatile memory cells programmed in a first operation and not programmed in a second operation.

9. The apparatus of claim 8, wherein the one or more control circuits are further configured to read the corresponding target word line using the read voltage to obtain partial data programmed in the first operation and to use the partial data to further program the non-volatile memory cells in the second operation.

10. The apparatus of claim 1, wherein the plurality of non-volatile memory cells are located in a three-dimensional memory structure, the first neighboring word line is immediately above the corresponding target word line and the second neighboring word line is immediately below the corresponding target word line.

11. A method comprising:
identifying a first target word line and a second target word line to be read;
determining that non-volatile memory cells of a first subsequent word line that is subsequent to the first target word line in a programming order are in an erased condition;
in response to determining that the non-volatile memory cells of the first subsequent word line are in the erased condition, determining an amount of charge in non-volatile memory cells of a prior word line that is prior to the first target word line in the programming order;
determining a first read voltage for non-volatile memory cells of the first target word line according to the amount of charge in the non-volatile memory cells of the prior word line;
reading the non-volatile memory cells of the first target word line using the first read voltage;
determining that non-volatile memory cells of a second subsequent word line that is subsequent to the second target word line in the programming order are not in the erased condition;
in response to determining that the non-volatile memory cells of the second subsequent word line are not in the erased condition, determining an amount of charge in non-volatile memory cells of the second subsequent word line;
determining a second read voltage for non-volatile memory cells of the second target word line according to the amount of charge in the non-volatile memory cells of the second subsequent word line; and
reading the non-volatile memory cells of the second target word line using the second read voltage.

12. The method of claim 11 wherein determining the amount of charge in non-volatile memory cells of the prior word line includes sensing the non-volatile memory cells of the prior word line while applying a predetermined read voltage on the prior word line and determining the amount of charge in non-volatile memory cells of the second subsequent word line includes sensing the non-volatile memory cells of the second subsequent word line while applying the predetermined read voltage on the second subsequent word line.

13. The method of claim 12 wherein the amount of charge in the non-volatile memory cells of the prior word line is determined to be less than a threshold amount, the amount of charge in the non-volatile memory cells of the second subsequent word line is determined to be more than the threshold amount, and the first read voltage is lower than the second read voltage.

14. The method of claim 11 further comprising:
- determining a first mapping of read voltages including the first read voltage to non-volatile memory cells for reading non-volatile memory cells of the first target word line;
- reading the non-volatile memory cells of the first target word line using the first mapping of read voltages to obtain two or more bits of data;
- determining a second mapping of read voltages including the second read voltage to non-volatile memory cells for reading non-volatile memory cells of the second target word line; and
- reading the second target word line using the second mapping of read voltages to obtain two or more bits of data.

15. The method of claim 14 further comprising subsequently additionally programming the first target word line and the second target word line.

16. The method of claim 15 wherein additionally programming the first target word line and the second target word line includes programming non-volatile memory cells to data states that represent the two or more bits of data in combination with one or more additional bits of data.

17. The method of claim 16 wherein the two or more bits of data consists of two bits of data represented by four data states and the two or more bits of data in combination with the one or more additional bits of data consists of four bits of data represented by sixteen data states.

18. The method of claim 11 wherein determining that the non-volatile memory cells of the second subsequent word line are not in the erased condition includes sensing at a predetermined read voltage, the sensing further used to determine the amount of charge in the non-volatile memory cells of the second subsequent word line.

19. A data storage system comprising:
- a plurality of non-volatile memory cells coupled to a plurality of word lines; and
- means for reading the plurality of non-volatile memory cells by, for each word line to be read, identifying either a prior word line or a subsequent word line in a programming order as a selected neighboring word line based on whether non-volatile memory cells of the subsequent word line are in an erased condition, and determining a read voltage for non-volatile memory cells of each word line to be read according to an amount of charge in non-volatile memory cells of a corresponding selected neighboring word line.

20. The data storage system of claim 19, wherein the plurality of non-volatile memory cells are configured for programming into four data states representing two bits of data in a first programming operation and subsequent programming into sixteen data states representing the two bits of data and an additional two bits of data in a second programming operation.

* * * * *